(12) United States Patent
Krencker et al.

(10) Patent No.: US 8,683,816 B2
(45) Date of Patent: Apr. 1, 2014

(54) HEAT EXCHANGER DEVICE AND NMR INSTALLATION THAT COMPRISES SUCH A DEVICE

(75) Inventors: Patrick Krencker, Brumath (FR); Daniel Podadera, Niederlauterbach (FR)

(73) Assignee: Bruker Biospin SA, Wissembourg (FR)

( * ) Notice: Subject to any disclaimer, the term of this patent is extended or adjusted under 35 U.S.C. 154(b) by 1077 days.

(21) Appl. No.: 12/355,422

(22) Filed: Jan. 16, 2009

(65) Prior Publication Data

US 2009/0183860 A1    Jul. 23, 2009

(30) Foreign Application Priority Data

Jan. 21, 2008  (FR) ...................................... 08 50371

(51) Int. Cl.
*F25B 19/00*  (2006.01)
*F25D 19/00*  (2006.01)

(52) U.S. Cl.
CPC .................................... *F25D 19/006* (2013.01)
USPC ............... 62/51.1; 62/424; 165/164; 165/200

(58) Field of Classification Search
CPC ........ F28F 27/00; F28F 1/003; F28D 7/0066; F25D 19/006
USPC .......................... 62/51.1; 165/104.13, 104.14
See application file for complete search history.

(56) References Cited

U.S. PATENT DOCUMENTS

| 3,116,427 | A | * | 12/1963 | Giaever ............................ 257/39 |
| 3,195,620 | A | * | 7/1965 | Steinhardt, Jr. ............... 165/263 |
| 3,314,773 | A | * | 4/1967 | Deiness .......................... 62/51.1 |
| 3,492,830 | A | * | 2/1970 | Mulder .......................... 62/51.1 |
| 3,665,761 | A | * | 5/1972 | Gregory .......................... 374/31 |
| 3,910,063 | A | * | 10/1975 | Prast ................................ 62/610 |
| 3,943,774 | A | * | 3/1976 | Pollanz ............................ 374/28 |
| 4,715,186 | A | * | 12/1987 | Ishimaru et al. ............... 62/50.1 |
| 4,970,868 | A | * | 11/1990 | Grebe et al. ................... 62/51.1 |
| 6,768,300 | B2 | * | 7/2004 | Shirakawa et al. ............ 324/248 |
| 2008/0229761 | A1 | * | 9/2008 | Shirakawa ...................... 62/49.1 |

OTHER PUBLICATIONS

Allen et al., "Apparatus for Low-Temperature Magic-Angle Spinning NMR", Journal of Magnetic Resonance, 92, pp. 614-617, 1991.*

* cited by examiner

*Primary Examiner* — Allen Flanigan
*Assistant Examiner* — Filip Zec
(74) *Attorney, Agent, or Firm* — Young & Thompson

(57) ABSTRACT

A heat exchanger delivers a pressurized dry gas stream cooled to an essentially constant temperature. The gas stream circulates in a coil with a functional part immersed in a liquid fraction of a second gas in a chamber of a corresponding container, whereby a portion of the wall of the container with the chamber contacts a liquid fraction of a third gas, providing a condensation surface for the second gas. The container containing the second pressurized gas is airtight. The condensation surface is dimensioned to allow absorption of a predetermined caloric power by the gas in the chamber without significant variation of temperature/pressure. Included is a monitored variable heater of the bath of the liquid fraction of the residual gas in the container, whereby total caloric power released by the circulating gas to be cooled and by the heater is constantly kept approximately equal to the specified caloric power.

21 Claims, 5 Drawing Sheets

HEAT EXCHANGER DEVICE AND NMR INSTALLATION THAT COMPRISES SUCH A DEVICE

BACKGROUND OF THE INVENTION

1. Field of the Invention

This invention relates to the field of refrigeration, more particularly the production of a low-temperature gas stream, and it has as its object a heat exchanger device, as well as an NMR installation that uses such a device.

2. Description of the Related Art

In many technical fields, and in particular in the field of Nuclear Magnetic Resonance (NMR), it is necessary to use a low-temperature gas stream, i.e., in particular lower in temperature than 100° K and in particular close to the temperature of liquid nitrogen (77.3° K).

These cold gas streams are used in particular to cool the sample that is to be analyzed and the equipment parts that are in contact with the latter or to keep them at a low temperature, but also, if necessary, to generate mechanical, static or dynamic actions.

Thus, in NMR (MAS) of the solid, the sample tube, called a rotor, is in rapid rotation (at several KHz, and even several tens of KHz) during the measurement phase, whereby the rotation of the sample makes it possible to improve the quality of the measurement spectra.

There is also a great advantage in carrying out MAS (Magic-Angle Spinning) analyses at low or very low temperatures for different scientific reasons (phase transitions, monitoring of reactions, etc.).

The low-temperature MAS analyses require special equipment and very cold gases, preferably, in the current context, as close as possible to the temperature of liquid nitrogen (77.3 K).

In a known manner, the MAS-type NMR analyses are generally carried out by means of a probe that comprises a stator part and a rotor part, constituted by the sample tube that rotates in the stator.

It is possible in particular to note the following points regarding the constitution and the operation of a MAS probe of the above-mentioned type:

Presence of two gas bearings (supplied by a so-called "bearing" gas) that support the sample tube that is called a rotor (gaseous levitation);

The rotation of the rotor is carried out by a so-called "drive" gas whose pressurized ejection at one or several nozzle (s) brings about a more or less rapid rotation of the sample that is placed in the rotor (equipped with blades or analogous formations);

The temperature of the sample is monitored by a third gas designated as "VT."

By way of numbered examples that illustrate the characteristics of the gas streams that are currently implemented at the level of an MAS NMR probe, it is possible to indicate:

"Bearing" gas pressure of 2 to 4 bar/flow rate: up to 50 to 80 Nl/minute;

"Drive" gas pressure of 1 to 2 bar/flow rate: 10 to 20 l/minute, typically (depends on the speed of rotation);

"VT" gas pressure that is less than 1 bar/flow rate: 30 l/minute.

In practice, the gas that is used in these applications is nitrogen for reasons of cost, comfort of use and limitation of risks. However, other types of gas can be considered, such as argon, helium, oxygen, . . . , based on applications and temperatures to be reached.

In a conventional manner, it is possible to produce low-temperature gas streams very simply by making the latter circulate in coils or exchangers that are immersed in a liquid gas bath, advantageously of the same nature as the circulating gas that is to be cooled.

This simple technique, however, has a major drawback, which is very detrimental to the applications mentioned above.

Actually, the cooling of a pressurized gas brings about a condensation of said gas and, consequently, in the coil or pipe mentioned above, the formation of liquid gas droplets. In addition, the flow rate then becomes unstable, and there are pressure fluctuations.

However, in particular in the context mentioned above, it is extremely important to provide a stream of dry cold gas, i.e., droplet-free gas, for the production of the bearings that maintain and guide the rotor in rotation.

Actually, if the so-called "bearing" gas undergoes condensation bringing about the formation of droplets, the result is a major malfunctioning of the bearings (because of the pressure fluctuations that are generated). This malfunctioning and the instabilities that it involves can produce a physical contact between the rotor and the stator that can damage and even destroy the sample tube, with pollution and/or damage of the stator, and even of the probe.

Thus, the primary problem posed in this invention is to propose a device that makes it possible to provide at least one stream of dry cold gas, in particular in the context described above, and to prevent the above-referenced drawbacks.

The publication "Apparatus for Low-Temperature Magic-Angle Spinning NMR ("Appareil pour la RMN basse température avec rotation à l'angle magique"), P. J. Allen et al., Journal of Magnetic Resonance 92, 614-617 (1991), proposes a heat exchanger device that can deliver at least one pressurized gas stream that is cooled to an essentially constant temperature. The gas streams circulate, in the device according to this document, in a coil or a corresponding analogous pipe of which a functional part is immersed in a liquid fraction of a second gas that is present in a chamber of a corresponding container, whereby the wall of the container that delimits said chamber is in contact with a liquid fraction of a third gas, so as to constitute a condensation surface for the second gas.

The device according to this publication actually comprises two intertwined coils providing the "bearing" gas and the "drive" gas, whereby these two coils are immersed in a liquid N2 gas bath that is present in a container that is itself immersed in a liquid N2 bath.

However, this publication does not mention the problem of providing dry gas, in particular after the sample tube is changed, and the internal pressure of the container is simply monitored by a pressure regulator. The construction of the chamber in copper can produce a super-cooling of the liquid gas of the container, upon shutdown, and can bring about the condensation of the gas that circulates in the coil.

SUMMARY OF THE INVENTION

This invention therefore has as its object a heat exchanger device that can deliver at least one dry gas stream that is pressurized and cooled to an essentially constant temperature, said at least one gas stream circulating, in the device, in a coil or a corresponding analogous pipe of which a functional part is immersed in a liquid fraction of a second gas that is present in a chamber of a corresponding container, whereby at least a portion of the wall of the container that delimits said chamber is in contact with a liquid fraction of a third gas, so as to constitute a condensation surface for the second gas, device that is characterized in that the container or each container is an airtight container that can contain the second pressurized gas, in that the condensation surface is dimensioned to allow the absorption of a predetermined caloric power by the gas that is contained in the chamber of said container without a significant variation of its temperature and its pressure, and in that the device also comprises a monitored variable heating means of the bath that is formed by the liquid fraction of the resident gas in the container, whereby the total caloric power released, on the one hand, by the circulating gas that is to be cooled and, on the other hand, by the heating means is constantly kept approximately equal to the above-mentioned specified caloric power.

BRIEF DESCRIPTION OF THE DRAWING FIGURES

The invention will be better understood owing to the description below, which relates to preferred embodiments that are provided by way of nonlimiting examples and are explained with reference to the accompanying diagrammatic drawings, in which.

DETAILED DESCRIPTION OF THE INVENTION

Figure 1:
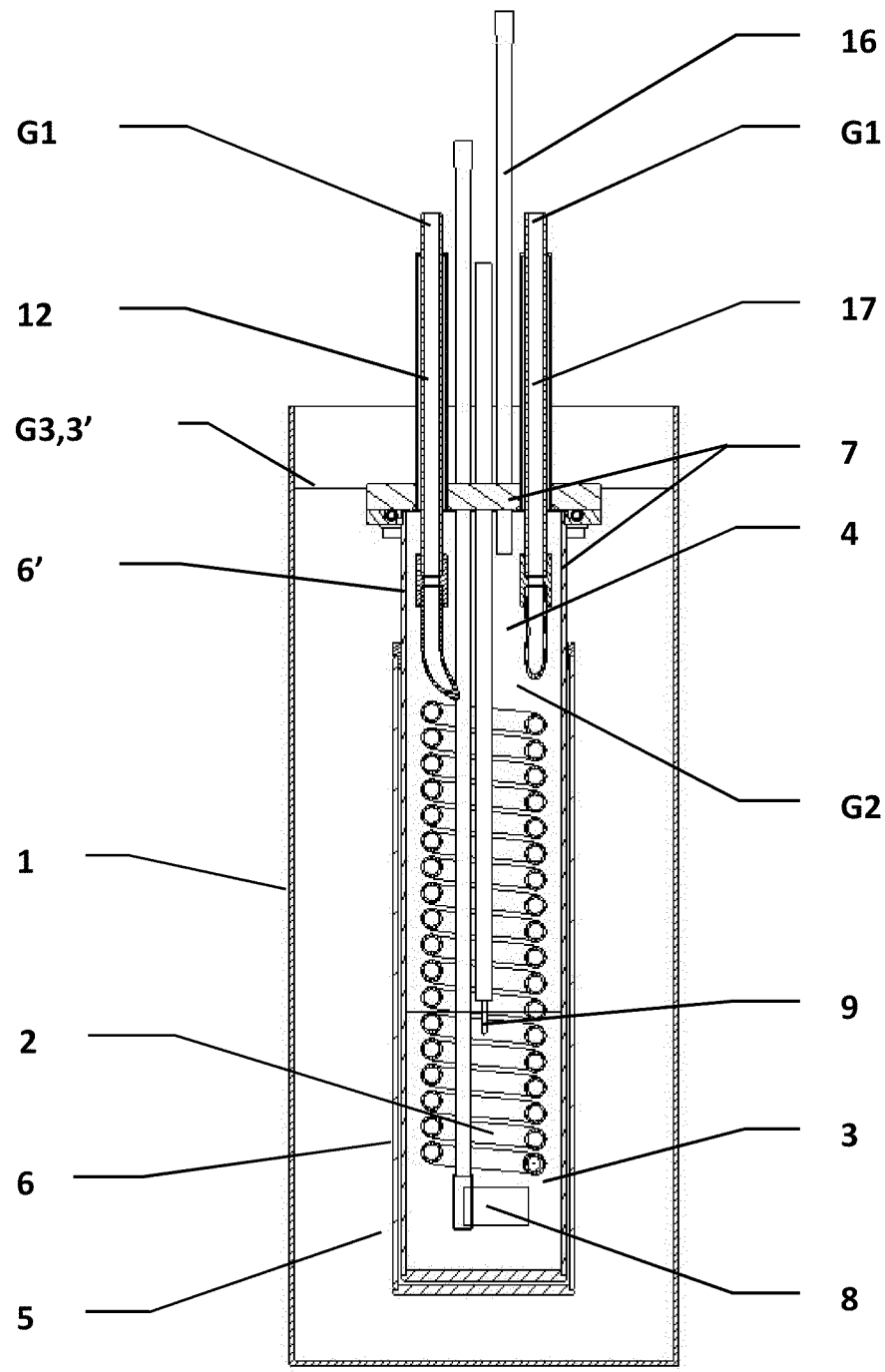
FIG. 1 is a cutaway view of a heat exchanger device according to the invention that delivers a single stream of cooled gas.

FIGS. 1 to 5 show, at least in part, a heat exchanger device 1 that can deliver at least one pressurized dry gas stream G1 that is cooled to an essentially constant temperature, said at least one gas stream G1 circulating, in the device 1, in a coil or a corresponding analogous pipe 2 of which a functional part 2' is immersed in a liquid fraction 3 of a second gas G2 that is present in a chamber 4 of a corresponding container 5. At least a portion 6' of the wall 6 of the container 5 that delimits said chamber 4 is in contact with a liquid fraction 3' of a third gas G3, so as to constitute a condensation surface 7 for the second gas G2, if necessary in cooperation with a cover or an airtight plug 6".

According to the invention, the container or each container 5 is an airtight container that can contain the second pressurized gas G2. In addition, the condensation surface 7 is dimensioned so as to allow the absorption of a caloric power PC that is predetermined by the gas G2 that is contained in the chamber 4 of said container 5 without significant variation of its temperature and its pressure. The device 1 also comprises a controlled variable heating means 8 of the bath that is formed by the liquid fraction 3 of the resident gas G2 in the container 5, whereby the total caloric power released, on the one hand, by the circulating gas G1 that is to be cooled and, on the other hand, by the heating means 8 is constantly kept approximately equal to the above-mentioned specified caloric power PC.

The dimensioning of the condensation surface 7 is done structurally, for gases G1, G2 and G3 of the given types and for the pressure and temperature conditions provided for the gases G2 and G3, such that even under the extreme operating conditions that are expected for the device 1, i.e., with values of flow rate, pressure and temperature differential of the circulating gas G1 that is to be cooled bringing about a maximum caloric exchange, the heating means 8 is always supplied, if necessary very sparingly.

Likewise, the heating means 8 is dimensioned structurally such that it can maintain the temperature and pressure conditions for the resident gas G2 in the chamber 4 in the absence of any circulation of the gas G1 that is to be cooled.

A positive monitoring of conditions prevailing in the chamber 4 is thus carried out under any foreseeable operating circumstances.

Likewise, the diameter, the width, and the configuration of the portion 2' of the pipe or coil 2 (preferably with a helicoidal structure) are defined structurally to result in an optimized heat exchange, if possible with a minimum space requirement.

According to one characteristic of the invention, the device 1 also comprises a means 9 for measuring the temperature and/or the pressure of the resident gas G2 in the chamber 4 of the airtight container 5, namely a means for measuring the temperature of the liquid fraction 3 of this gas G2 and/or a means for measuring the pressure of the gas fraction of said gas G2.

Of course, by acting on the power supply of the heating means 8 (of the electrical resistor type located in or around the container 5), it is possible to manually adjust keeping a balance between powers released and power absorbed.

However, in accordance with an automation of this adjustment, the power supply of the monitored variable heating means 8, and therefore the caloric power released by the latter, is regulated based on the temperature and/or the pressure detected by the corresponding measurement means 9, preferably so as to keep the resident gas G2 in the airtight chamber 4 of the container 5 in a boiling state.

Although different configurations in terms of combinations of gases G1 and G2 are possible, in particular based on required applications and temperatures, it is advantageously provided, for practical reasons, that the circulating gas G1 that is to be cooled and the resident gas G2 in the chamber 4 of the airtight container 5 are of the same type and consist in particular of nitrogen, whereby the internal pressure in said chamber 4 is greater than or equal to the pressure that prevails in the coil 2 or the like and the temperature and pressure conditions in the chamber 4 of the airtight container 5 keep the resident gas G2 there at a boil.

According to a preferred design of the device 1 according to the invention, becoming evident in particular from FIGS. 1 and 3 to 5, the airtight container or each airtight container 5 has a wall 6 that is thermally insulated except for the portion of wall 6' that delimits the condensation surface 7 for the resident gas G2 in the chamber 4 (or a part of this surface 7 when the cover 6" that is brought back also contributes to the condensation), whereby this wall portion 6' forms the upper part or is located in the upper part of the container 5, preferably without being in contact with the bath 3 of liquid gas G2 that is present in said chamber 4.

The liquid fraction 3 of the resident gas G2 is consequently collected in a receptacle that essentially is not subject to any outside heat influence and that ensures a good heat stability of said bath 3.

Figure 2:
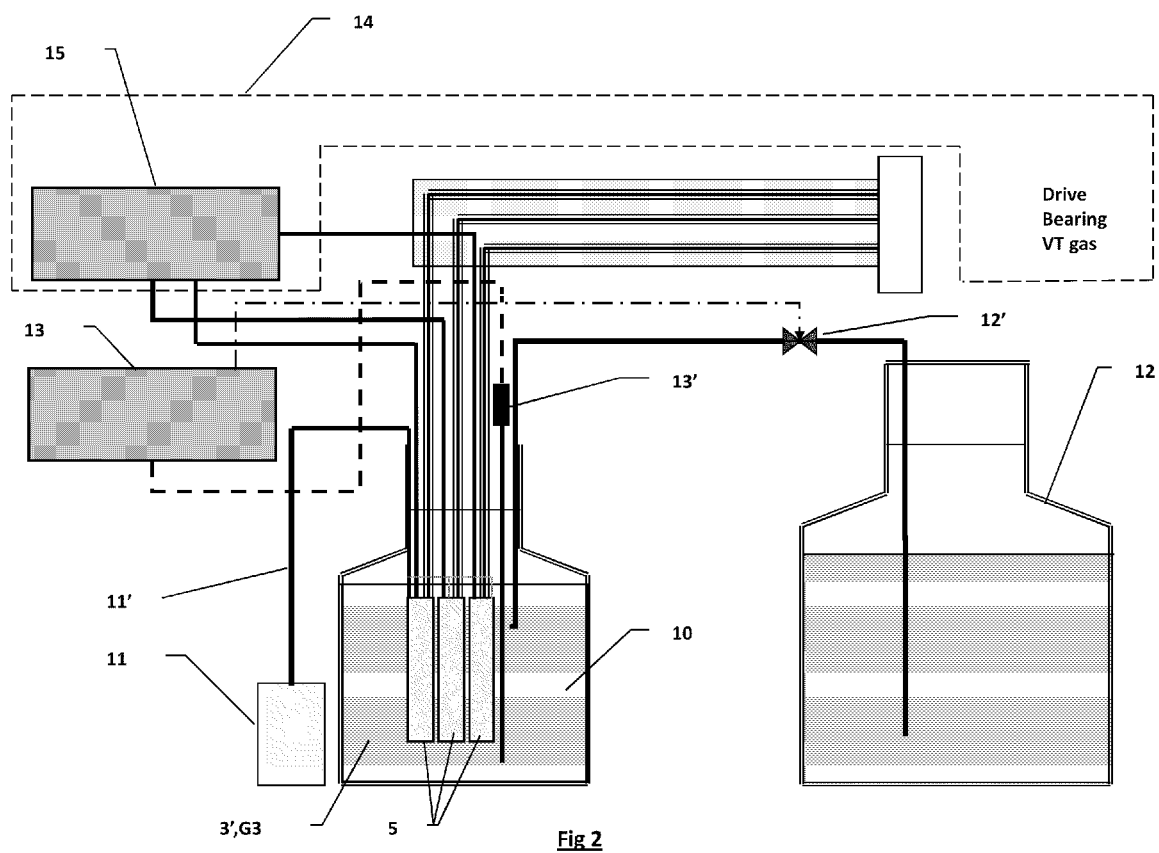
FIG. 2 is a diagrammatic and mechanical representation of a heat exchanger device according to the invention, with its monitoring means, able to deliver three streams of cooled gas and combined with an MAS NMR installation.
Figure 3:
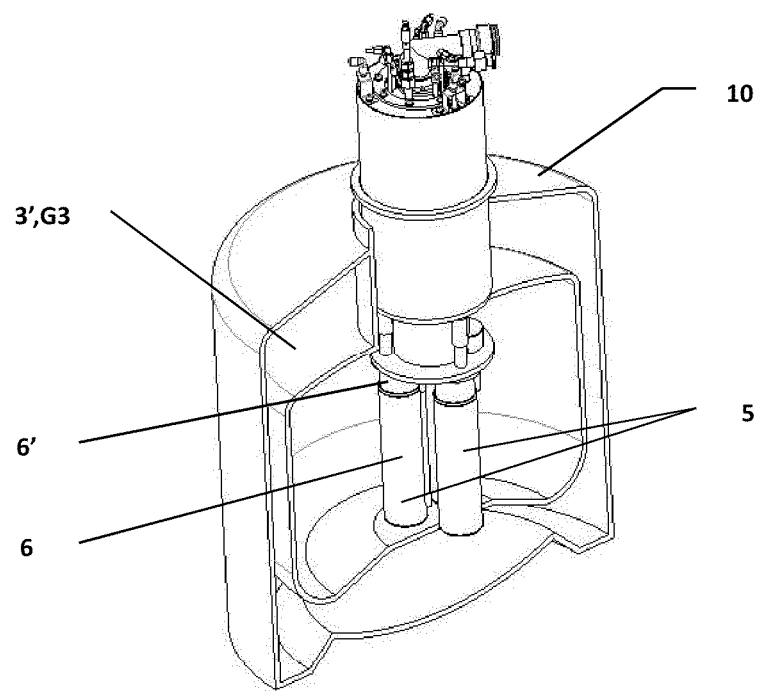
FIG. 3 is a partial cutaway view of an embodiment of a part of the device that is shown diagrammatically in FIG. 2.

In accordance with a preferred practical embodiment, becoming evident from FIGS. 1 to 3 in particular, the airtight container or each airtight container 5 is totally immersed in a bath 3' of liquid gas G3, preferably at atmospheric pressure and advantageously with a nature that is identical to the circulating gas G1 that is to be cooled and to the resident gas G2 in the chamber 4 of said container 5, whereby said airtight container or each airtight container advantageously has an essentially cylindrical general structure with a double wall 6 with a heat insulation property (Dewar vase principle), except for an upper part with a single wall 6' that delimits the inside condensation surface 7 for the resident gas G2 in the chamber 4 of said container 5 (the portion of wall 6' is made of a good heat-conducting material, such as, for example, metal), if necessary in combination with the cover 6".

The cover 6" that closes the volume 4 to gases in an airtight manner can, based on its design and construction (with thermal insulation) and according to whether or not it is immersed in the bath 3', participate or not, optionally with a variable contribution, to the formation of the condensation surface. If necessary, the condensation surface 7 can be formed only by the wall portion 6', optionally integrating an end closing part forming an integrated cover 6".

It will be noted that the insulation properties of the double wall 6 are reinforced when the corresponding container 5 is immersed in the bath 3' of gas G3 (space pushed into the interstitial volume of the double wall).

When a single cooled gas flow G1 is required, the assembly of FIG. 1 can be a suitable embodiment.

However, when the supply of at least two different streams of cooled gas G1, whether or not they have the same characteristics, is required, it is provided according to the invention that the device 1 comprises at least two separate airtight containers in each of which is mounted a coil or an analogous pipe 2 for the circulation of a gas G1 that is to be refrigerated, whereby said containers 5 are all totally immersed in the same bath 3' of liquid gas G3 that is present in a common container 10 that is thermally insulated (for example of the Dewar vase type).

In the case of the MAS NMR application mentioned in the introduction herein, the device 1 is advantageously provided for supplying three separate cooled gas streams (FIG. 2—multiplication of the containers 5 of FIG. 1).

According to a first optional arrangement of the invention, at least one of the internal state parameters of the different airtight containers 5, namely the temperature of the liquid bath 3 and/or the pressure of the resident gas G2 in the chambers 4 of said containers 5, is different from one container to the next, as well as optionally the dimensions of their respective condensation surfaces 7, the dimensional characteristics or the configuration of the coils 2 and/or the characteristics of their respective heating means 8.

According to a second optional arrangement of the invention, it can optionally also be provided that at least one of the parameters of the group comprising pressure, temperature before cooling, temperature after cooling, and flow rate, is different for the gases G1 that are to be cooled and that circulate in the coils or analogous pipes 2 that are mounted in the different airtight containers 5, based on stresses linked to the different applications of the various gas streams G1.

In accordance with an additional characteristic of the invention that becomes evident diagrammatically from FIG. 2, each of the airtight containers 5 is connected to a corresponding tank 11 of pressurized gas G2 by a feeder 11', and the common container 10, accommodating the different airtight containers 5, is supplied by gas from a tank 12 via a transfer line 12', under the monitoring of a control unit 13 that receives measuring signals from a level sensor 13' combined with said common container 10.

For the sake of clarity, a single tank 11 and a single line 11' are shown in FIG. 2.

Thus, the device 1 according to the invention makes it possible to provide a cooled gas source whose temperature can be monitored even when the flow rate varies (within predetermined limits).

This principle can be easily scaled down to provide several separate or independent sources of cooled gas, optionally of different natures and/or having different output temperatures, different pressures and/or different flow rates (FIG. 2).

In support of FIGS. 1 to 5, a more detailed description of a practical nonlimiting embodiment of the invention, in relation to the use of nitrogen for the three gases in question G1, G2, and G3, is provided below, by nevertheless limiting the description to a single airtight container (whereby the latter can be transposed to each of the three containers 5 shown in FIGS. 2 to 5).

First of all, it is recalled that the supply of a dry cold gas G1 (without droplets), here $N_2$, is carried out simply by immersing an exchanger coil 2, in which this gas G1 circulates, in liquid nitrogen whose temperature is monitored.

For this purpose, the solution according to the invention consists in placing the coil 2 in a chamber 4 that is delimited by a pressurized container 5 that contains boiling $LN_2$. The boiling point is determined by the pressure of the gas prevailing on the surface of the liquid.

Figure 4:
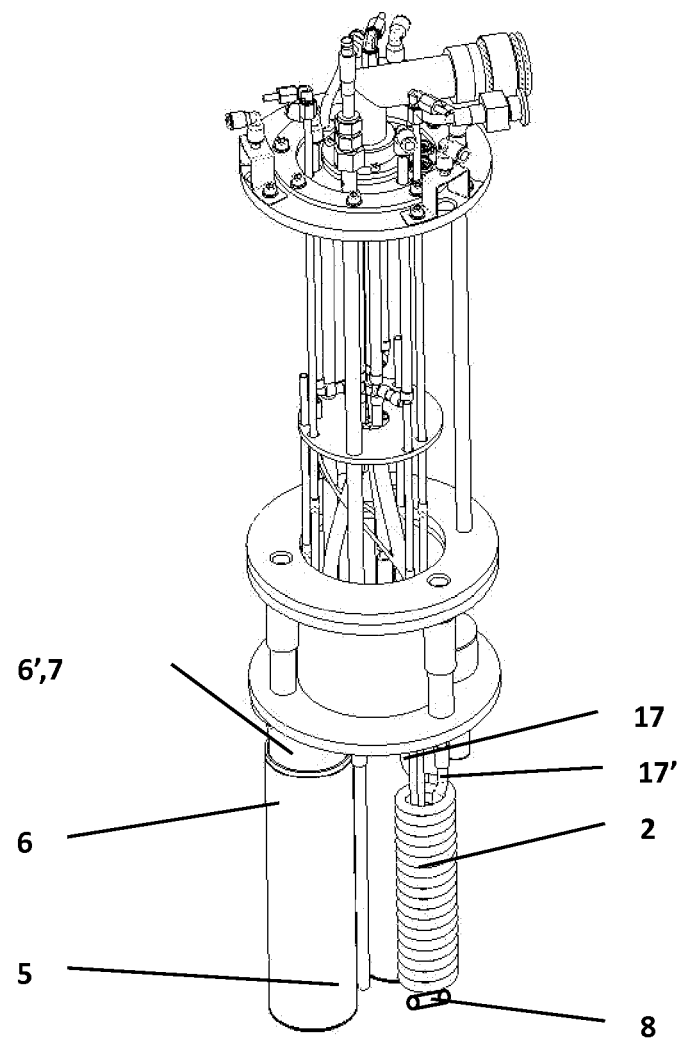
FIGS. 4 and 5 are partial cutaway depictions of the airtight containers that are part of the device shown in FIG. 3, as well as their fluid connection means according to two variant embodiments.
Figure 5:
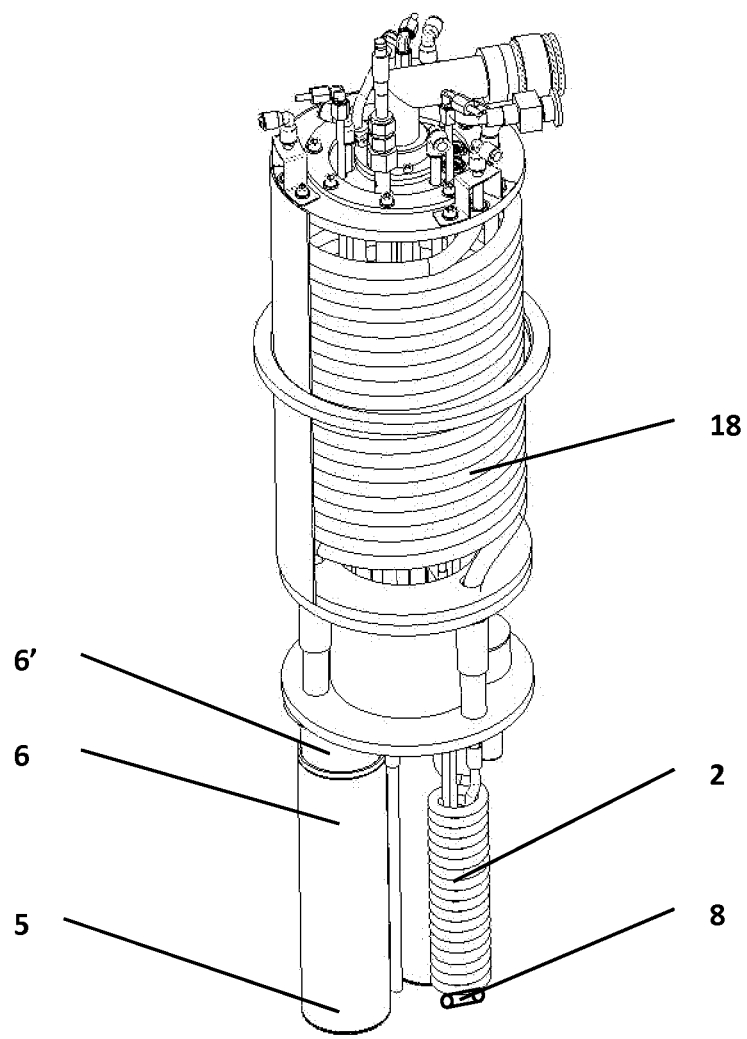

As is evident from FIG. 1 and partially from FIGS. 4 and 5, each container 5 comprises the following elements:

An airtight chamber 4 that is delimited by a stainless steel wall, whose internal pressure is monitored and of which the lower part is insulated by a stainless steel double wall 6, A tube 16 for the filling of gas G2 under pressure, An exchanger coil 2 with a lower functional part 2', A temperature sensor 9 (PT100) that passes through the upper part of the chamber, A heating resistor 8 (300 W) that passes through the upper part of the chamber, An intake 12 for gas G1 that is thermally insulated under vacuum, An outlet 17' for gas G1 that is thermally insulated under vacuum.

By way of example, the volume of the chamber 4 that contains the exchanger coil 2 can be approximately one liter. The chamber 4 is cylindrical and is closed by a removable upper cover that is attached by screws to a flange. The sealing of the closing of the cover is ensured by a metal joint that is placed in a groove.

As indicated above, the internal pressure of the chamber 4 is always greater than or equal to the pressure of the gas that is to be cooled and that circulates in the coil 2. In addition, the container 5 that delimits the chamber 4 is entirely immersed in a container or tank 10 that contains liquid nitrogen at atmospheric pressure (T=77.3 K).

During the filling of chamber 4, pressurized $N_2$ gas is injected therein (for example under 3 bar) from a corresponding tank 11, whereby the pressure is adjusted by a pressure regulator.

As the injection of gas into the chamber 4 proceeds, condensation of said gas is found at a condensation surface 7 that is formed by the upper part 6' of the wall of the chamber 4 (comprising the cover), which is in thermal contact with the liquid nitrogen of the tank 10, and the chamber 4 then gradually fills with liquid nitrogen forming a bath 3 that is collected in the lower part of the chamber 4.

The temperature sensor 9, as soon as it is in contact with the liquid nitrogen that forms the bath 3, indicates a temperature that corresponds to the boiling point (T° based on P), whereby this temperature is known and constant.

The filling is then stopped, whereby the sensor 9 is used as a level sensor and is mounted at a position that is specified for this purpose.

It should be recalled that the area of the condensation surface 7 is calculated to be able to condense a little more than the thermal output released by the gas G1 that circulates in the coil 2, under extreme operating circumstances.

At maximum flow rate, the hot "bearing" gas releases approximately 300 W into the chamber 4 and creates a high level of boiling of the bath 3'.

The exchange coefficient on the condensation surface 7 is, taking into account the single wall portion 6' forming it, about 1,500 to 2,000 W/m$^2$-K and depends on the internal pressure in the chamber 4.

If the boiling point is 92 K, the temperature difference with the wall at 77.3 K is approximately 15 K.

By allowing a heat exchange coefficient of 2,000 W/m$^2$-K and an output to be evacuated of 300 W, the result is a condensation surface area 7 of P=h*S*DT, which provides S=0.01 m$^2$, or 100 cm$^2$.

Within the framework of a practical embodiment according to FIGS. 3 to 5, the condensation zone can be composed of a cylindrical segment with a height of 4 cm and a diameter of 5.5 cm, or 69 cm$^2$.

At this value, it is necessary to add the surface area of the upper part of the cover: condensation surface area of the cover Pi×D$^2$/4−tube surface area=3.14*(5.5×5.5)/4−2×(2*2/4)*3.14=23.7−6.2 cm$^2$=17.50 cm$^2$.

Thus, the N$_2$ gas condenses on the upper part of the chamber 4 (single wall portion 6' that integrates the cover) and then returns in liquid form to the bottom of the chamber. The internal level of liquid nitrogen remains constant in the chamber 4.

When the operation of the device 1 is stopped, there is no circulation of gas G1 in the coil 2. Therefore, no heat is injected, and the boiling stops.

The absence of thermal feedstock is then compensated for by applying an additional heating power by means of the resistor 8. This power is monitored by an electronic regulator, optionally integrated with a more overall control unit (control of the NMR device), which measures either the temperature or the internal pressure of the chamber 4 and regulates the pressure in the chamber.

In the absence of the flow of gas G1, it is possible to apply up to 300 watts to keep the internal pressure constant at 3.3 bar (or a boiling point of 92 K).

The heating power that is delivered by the resistor 8 depends directly on the flow of gas G1 that circulates in the exchanger device 1, whereby its value is almost zero when the gas flow rate is at a maximum.

This embodiment according to the invention makes it possible to produce a perfectly dry N$_2$ gas. During the rise in pressure of the circuit, it is always ensured that there is no formation of droplets (the gas is dry). During the start-up phase, the pressure of the gas rises gradually from zero to the operating pressure.

The airtight and thermally-insulated tubular connections that form the intake and outlet 17 and 17' for the gas G1 that is to be cooled can optionally be extended by a device 18 for precooling the stream of hot gas G1 before its introduction into the chamber 4, by leaks of gas G3 coming from the container 10 (FIG. 5—structure with concentric pipes).

The level sensor or detector 13' can be, for example, a capacitive level sensor.

This invention also has as its object an NMR installation 14 that can carry out low-temperature MAS-type analyses by using a sample tube in rapid rotation and supported by gas bearings, installation 14 characterized in that it is supplied by gas forming the bearings, by gas for driving the sample tube in rotation, and by gas for cooling the sample by a heat exchanger device 1 as described above, optionally integrated with said installation 14.

Preferably, the unit 15 for control and monitoring of said installation 14 controls the operation of the heat exchanger device 1.

Of course, the invention is not limited to the embodiments described and shown in the accompanying drawings. Modifications are possible, in particular from the standpoint of the composition of various elements or by substitution of equivalent techniques, without thereby exceeding the scope of protection of the invention.

The invention claimed is:

1. A heat exchanger device that can deliver at least one pressurized dry gas stream that is cooled to an essentially constant temperature, comprising:

a coil or a corresponding analogous pipe in which said at least one gas stream circulates, a functional part of the coil or the corresponding analogous pipe being immersed in a liquid fraction of a second gas;

at least one container comprising a wall that delimits a chamber, the liquid fraction of the second gas being present in the chamber, at least a portion of the wall of the at least one container that delimits said chamber is in contact with a liquid fraction of a third gas, so as to constitute a condensation surface for the second gas, the at least one container being an airtight container that can contain the second pressurized gas, in that the condensation surface is dimensioned to allow absorption of a predetermined caloric power from the second pressurized gas that is contained in the chamber of said at least one container without a variation of the temperature and the pressure of said second gas of said at least one container; and controlled means for variable heating of a bath that is formed by the liquid fraction of resident gas in the container, wherein the total caloric power that is released in the second or resident gas which corresponds to the sum of the caloric powers provided by the circulating gas that is to be cooled and the means for variable heating, is constantly kept approximately equal to the predetermined caloric power, whereby the area of the condensation surface for the second resident gas is such that its caloric transfer capacity is slightly greater than a thermal output released by the first circulating gas under extreme operating conditions, in particular maximum flow rate, and whereby the means for heating always delivers heating power and said delivered heating power depends directly on a flow of the first circulating gas, a value of the heating power being maximum in the absence of any flow and being minimum at the maximum flow rate, thus always providing a control of the temperature and pressure conditions prevailing in each chamber containing the second gas.

2. The heat exchanger device according to claim 1, further comprising:

means for measuring the temperature and/or the pressure of the resident gas in the chamber of the airtight container, which is a means for measuring the temperature of the liquid fraction of the resident gas and/or a means for measuring the pressure of the gaseous fraction of said resident gas.

3. The heat exchanger device according to claim 2, wherein the supply of the monitored variable means for heating, and therefore the caloric power released by the means for heating, is regulated based on the temperature and/or the pressure detected by the corresponding means for measuring so as to keep the liquid fraction of the resident gas in the airtight chamber of the container in a boiling state.

4. The heat exchanger device according to claim 1, wherein the circulating gas that is to be cooled and the resident gas in the chamber of the airtight container are the same and comprise nitrogen, whereby the internal pressure in said chamber is greater than or equal to the pressure prevailing in the coil or a corresponding analogous pipe, and the temperature and pressure conditions in the chamber of the airtight container keep the liquid fraction of the resident gas at a boil.

5. The heat exchanger device according to claim 1, wherein the at least one airtight container has a thermally insulated wall except for the wall portion that defines the condensation surface for the resident gas in the chamber, whereby the wall portion forms an upper part or is located in an upper part of the container without being in contact with the bath of liquid resident gas that is present in said chamber.

6. The heat exchanger device according to claim 1, wherein the at least one airtight container is totally immersed in a bath of liquid gas at atmospheric pressure and the liquid gas is identical to the circulating gas that is to be cooled and to the resident gas in the chamber of said container, whereby said at least one airtight container has a cylindrical general structure with a thermally insulated double wall with an exception of an upper part with a single wall that delimits the internal condensation surface for the resident gas in the chamber of said container.

7. The heat exchanger device according to claim 1, wherein the heat exchanger further comprises at least two separate airtight containers in each of which is mounted a coil or an analogous pipe for the circulation of a gas that is to be refrigerated, whereby said containers are all totally immersed in the same bath of liquid gas that is present in a common thermally insulated container.

8. The heat exchanger device according to claim 7, wherein at least one of internal state parameters of the different airtight containers, which are the temperature of the liquid bath and/or the pressure of the residual gas in the chambers of said containers, is different from one container to the next, as well as optionally dimensions of their respective condensation surfaces, dimensional characteristics or configuration of the coils and/or the characteristics of their respective means for heating.

9. The heat exchanger device according to claim 7, wherein at least one of the parameters of pressure, temperature before cooling, temperature after cooling, or flow rate, is different for the gases that are to be cooled and that circulate in the coils or analogous pipes that are mounted in the different airtight containers.

10. The heat exchanger device according to claim 7, wherein each of the airtight containers is connected to a corresponding tank of pressurized gas via a feed line and wherein the common container, accommodating the different airtight containers, is supplied with gas from a tank via a transfer line, under the monitoring of a control unit that receives measuring signals from a level sensor that is combined with said common container.

11. An NMR installation that can carry out low-temperature MAS-type analyses by using a sample tube in rapid rotation and supported by gas bearings, the installation being configured to be supplied by gas forming the bearings, by gas for driving the sample tube in rotation, and by gas for cooling the sample by a heat exchanger device, according to claim 7, optionally integrated with said installation.

12. The installation according to claim 11, wherein a unit for controlling and monitoring said installation controls operation of the heat exchanger device.

13. The heat exchanger device according to claim 2, wherein the circulating gas that is to be cooled and the resident gas in the chamber of the airtight container are the same and comprise nitrogen, whereby an internal pressure in said chamber is greater than or equal to a pressure prevailing in the coil or corresponding analogous pipe, and the temperature and pressure conditions in the chamber of the airtight container keep the liquid fraction of the resident gas at a boil.

14. The heat exchanger device according to claim 3, wherein the circulating gas that is to be cooled and the resident gas in the chamber of the airtight container are the same and comprise nitrogen, whereby an internal pressure in said chamber is greater than or equal to a pressure prevailing in the coil or corresponding analogous pipe, and the temperature and pressure conditions in the chamber of the airtight container keep the liquid fraction of the resident gas at a boil.

15. The heat exchanger device according to claim 2, wherein the at least one airtight container has a thermally insulated wall with an exception of a wall portion that defines the condensation surface for the resident gas in the chamber, whereby this wall portion forms an upper part or is located in an upper part of the container without being in contact with the bath of liquid gas that is present in said chamber.

16. The heat exchanger device according to claim 3, wherein the at least one airtight container has a thermally insulated wall with an exception of a wall portion that defines the condensation surface for the resident gas in the chamber, whereby this wall portion forms an upper part or is located in an upper part of the container without being in contact with the bath of liquid gas that is present in said chamber.

17. The heat exchanger device according to claim 4, wherein the at least one airtight container has a thermally insulated wall with an exception of a wall portion that defines the condensation surface for the resident gas in the chamber, whereby this wall portion forms an upper part or is located in an upper part of the container without being in contact with the bath of liquid gas that is present in said chamber.

18. The heat exchanger device according to claim 2, wherein the at least one airtight container is totally immersed in a bath of liquid gas at atmospheric pressure and the liquid gas is identical to the circulating gas that is to be cooled and to the resident gas in the chamber of said container, whereby said at least one airtight container has an essentially cylindrical general structure with a thermally insulated double wall with exception of an upper part with a single wall that delimits the internal condensation surface for the resident gas in the chamber of said container.

19. The heat exchanger device according to claim 3, wherein the at least one airtight container is totally immersed in a bath of liquid gas at atmospheric pressure and the liquid gas is identical to the circulating gas that is to be cooled and to the resident gas in the chamber of said container, whereby said at least one airtight container has an essentially cylindrical general structure with a thermally insulated double wall with exception of an upper part with a single wall that delimits the internal condensation surface for the resident gas in the chamber of said container.

20. A heat exchanger device for NMR that can deliver at least one pressurized dry gas stream that is cooled to an essentially constant temperature, comprising:
a coil or a corresponding analogous pipe in which said at least one gas stream circulates, a functional part of the coil or the corresponding analogous pipe being immersed in a liquid fraction of a second gas;

at least one container comprising a wall that delimits a chamber, the liquid fraction of the second gas being present in the chamber, at least a portion of the wall of the at least one container that delimits said chamber is in contact with a liquid fraction of a third gas, so as to constitute a condensation surface for the second gas, the at least one container being an airtight container that can contain the second pressurized gas, in that the condensation surface is dimensioned to allow absorption of a predetermined caloric power by the second pressurized gas that is contained in the chamber of said at least one container without a variation of a temperature and a pressure of said second gas of said at least one container; and a controlled variable heater of a bath that is formed by the liquid fraction of resident gas in the container, wherein the total caloric power that is released in the second or resident gas and which corresponds to the sum of the caloric powers provided by the circulating gas that is to be cooled and the variable heater is constantly kept approximately equal to the predetermined caloric power, whereby the area of the condensation surface for the second resident gas is such that its caloric transfer capacity is slightly greater than a thermal output released by the first circulating gas under extreme operating conditions, in particular maximum flow rate, and whereby the variable heater always delivers heating power and said delivered heating power depends directly on a flow of the first circulating gas, a value of the heating power being maximum in the absence of any flow and being minimum at the maximum flow rate, thus always providing a control of the temperature and pressure conditions prevailing in each chamber containing the second gas.

21. A heat exchanger device for NMR that can deliver at least one pressurized dry gas stream that is cooled to a constant temperature, comprising:

a coil or a corresponding analogous pipe in which said at least one gas stream circulates, a functional part of the coil or the corresponding analogous pipe being immersed in a liquid fraction of a second gas;

at least one container comprising a wall that delimits a chamber, the liquid fraction of the second gas being present in the chamber, at least a portion of the wall of the at least one container that delimits said chamber is in contact with a liquid fraction of a third gas, so as to constitute a condensation surface for the second gas, the at least one container being an airtight container that can contain the second pressurized gas, in that the condensation surface is dimensioned to allow absorption of a predetermined caloric power by the second pressurized gas that is contained in the chamber of said at least one container without a variation of a temperature and a pressure of said second gas of said at least one container; and a controlled variable heater of a bath that is formed by the liquid fraction of resident gas in the container, wherein the total caloric power that is released in the second or resident gas which corresponds to the sum of the caloric powers provided by the circulating gas that is to be cooled and the variable heater is constantly kept equal to the predetermined caloric power, whereby the area of the condensation surface for the second resident gas is such that its caloric transfer capacity is greater than a thermal output released by the first circulating gas under extreme operating conditions, in particular maximum flow rate and whereby the variable heater always delivers heating power and said delivered heating power depends directly on a flow of the first circulating gas, a value of the heating power being maximum in the absence of any flow and being minimum at the maximum flow rate, thus always providing a control of the temperature and pressure conditions prevailing in each chamber containing the second gas.

* * * * *